United States Patent
Pascucci et al.

[11] Patent Number: 5,821,788
[45] Date of Patent: Oct. 13, 1998

[54] ZERO CONSUMPTION POWER-ON-RESET

[75] Inventors: Luigi Pascucci, Sesto S. Giovanni; Paolo Rolandi, Voghera; Marco Fontana, Milan; Antonio Barcella, Trescore Balneario, all of Italy

[73] Assignee: SGS-Thomson Microelectronics S.r.l., Agrate Brianza, Italy

[21] Appl. No.: 790,832

[22] Filed: Jan. 30, 1997

[30] Foreign Application Priority Data

Feb. 2, 1996 [EP] European Pat. Off. ............. 96830046

[51] Int. Cl.$^6$ ........................................................ H03L 7/00
[52] U.S. Cl. ............................................. 327/143; 327/199
[58] Field of Search ................................... 327/142, 143, 327/199

[56] References Cited

U.S. PATENT DOCUMENTS 5,343,085  8/1994  Fujimoro et al. ..................... 307/272.3
5,347,173  9/1994  McAdams ................................ 327/143

FOREIGN PATENT DOCUMENTS 0 675 501 A1  3/1994  European Pat. Off. .

*Primary Examiner*—Terry Cunningham
*Assistant Examiner*—Jeffrey Zweizig
*Attorney, Agent, or Firm*—Allen, Dyer, Doppelt, Milbrath & Gilchrist, P.A.

[57] ABSTRACT

A power-on-reset (P.O.R.) circuit produces a power-on-reset (P.O.R.) signal whose an amplitude tracks the voltage on a supply node until it exceeds a certain threshold. The circuit has a first monitoring and comparing circuit portion including at least a nonvolatile memory element having a control gate coupled to the supply node, a first current terminal coupled to a ground node, and a second current terminal coupled to a first node which is capacitively coupled to the supply node. The circuit further includes a second circuit portion that includes an intrinsically unbalanced bistable circuit, having a node that intrinsically is in a high state at power-on coupled to the first node that is intrinsically in a low state at power-on coupled to the input of an output buffer.

8 Claims, 1 Drawing Sheet

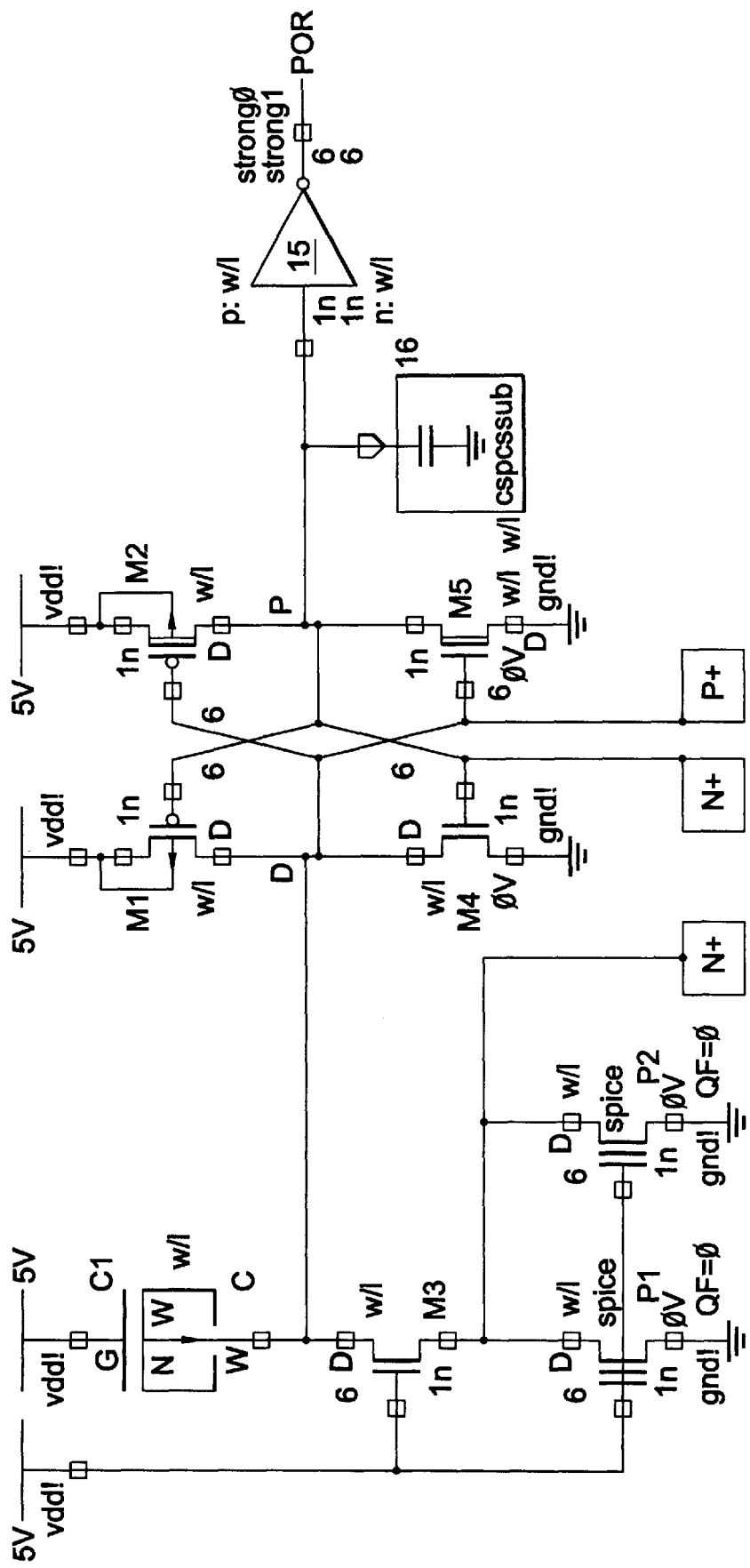

ZERO CONSUMPTION POWER-ON-RESET

FIELD OF THE INVENTION

This invention relates to a so-called power-on-reset (P.O.R.) circuit having a substantially null consumption which is particularly useful for integrated circuits that include nonvolatile memory blocks or arrays.

BACKGROUND OF THE INVENTION

Integrated logic circuits widely use power-on-reset circuits to assure a correct positioning or initialization of the circuits at power-on. In particular, nonvolatile memories use power-on-reset circuits to initialize registers containing redundancy addresses. Furthermore, in last generation memory devices, the reading of information recorded in a nonvolatile mode is internally synchronized, and requires a correct start-up when powering the device. This is assured by the use of power-on-reset circuits.

There are numerous examples of implementation of power-on-reset circuits, typically having a substantially null consumption. Known circuits are relatively complicated. Their characteristics depend on the fabrication process in a non-specific manner. Their adaptability to particular applications requires a careful designing not to jeopardize a correct device operation.

In case of memory devices or of integrated circuits including nonvolatile memory arrays, it is very important to assure a correct reading of information contained in a nonvolatile memory cell.

SUMMARY OF THE INVENTION

A power-on-reset circuit has now been devised that, differently from known circuits, bases its behavior directly as a function of the behavior of a generic memory cell, which is wholly identical to the memory array cells.

Basically, the invented circuit generates a power-on-reset signal at the moment of switching on the device which tracks the rise of the voltage on power supply rail of the integrated circuit up to a point where the supply voltage reaches a level that positively assures a correct reading of the information contained in a nonvolatile memory cell.

According to the invention, this is obtained by a circuit including a nonvolatile memory element that exactly reproduces the behavior of a generic array cell. The invented circuit comprises a bistable circuit also referred to as a latch, made in such a way that is intrinsically unbalanced at the power-on instant. As will be evident to a skilled technician, such an intrinsically unbalanced latch circuit can be realized in various manners.

According to a preferred embodiment, the bistable circuit includes two cross-coupled inverting stages, according to the so-called "back-to-back" architecture, wherein an unbalancing of the circuit is intrinsically assured at power-on by implementing the two inverting stages with devices having different switch-on threshold characteristics. Preferably, such a 35 pre-established diversity of switch-on threshold characteristics is implemented by realizing one stage with a pair of complementary enhancement transistors having a corrected enhancement threshold, and the other stage with a pair of complementary transistors with a "natural" threshold. The complementary transistors constituting this second stage are so-called "natural" type transistors, that is, with a low threshold ($\cong 0.4$ V) if they are of the n-channel type, and a relatively high threshold ($\cong 1.6$ V) if they are of the p-channel type.

Therefore, at power-on, the latch will position itself in a predefined unbalanced state, which is maintained until the voltage level on the supply rail of the integrated circuit reaches and exceeds a value that is established as a function of the actual threshold characteristics of the nonvolatile memory element used as a monitoring and comparing device of the voltage present on the supply node. The triggering of the bistable (latch) circuit is determined by the nonvolatile memory element of the circuit, which is functionally coupled to the intrinsically "high" node of the bistable circuit at power-on, and capacitively coupled also to the supply node. As a function of its intrinsic electrical characteristics tied to the manufacturing process, the nonvolatile memory element passes from a substantially non-conducting state to a conducting state when its own threshold is reached upon the rising of the voltage on the supply node. The conductivity of the nonvolatile memory element further increases upon the rising of the voltage on its drain node which, from the power-on instant, is coupled to the supply node and this process finally causes the switching of the bistable circuit, thus determining the end of the power-on-reset pulse produced by the circuit.

BRIEF DESCRIPTION OF THE DRAWINGS

The different aspects and advantages of the circuit of the invention will result even clearer through the following description of an important embodiment and by referring to the schematic circuit diagram shown in the attached sole drawing figure.

DETAILED DESCRIPTION OF PREFERRED EMBODIMENTS

With reference to the drawing, the circuit of the invention employs a bistable circuit that, according to a preferred embodiment, includes two, cross-coupled inverting stages, in a so-called back-to-back configuration, formed by the transistors M1, M2, M4 and M5. A certain initial unbalance of the bistable circuit is assured by the fact that, as is clearly shown on the diagram, the two pairs of complementary transistors have different intrinsic characteristics.

According to this preferred embodiment, the complementary transistors M2 (p-channel) and M5 (n-channel) of one or the two stages are both "natural" transistors, that is, with high and low thresholds respectively. By contrast, the complementary transistors, M1 (p-channel) and M4 (n-channel), that form the other inverting stage, are both enhancement type transistors, that is, with a "corrected" threshold. Therefore, at the power-on instant, the bistable circuit is intrinsically unbalanced, thus ensuring a low potential (approximately at ground potential) on the P node, and a high potential (approximately at the voltage present on the supply rail) on the D node. Under these conditions, that is at the power-on instant, the output buffer B will output a P.O.R. signal having an amplitude substantially identical to the Vdd voltage on the supply node of the circuit during its evolution (rise) toward the nominal value of 5 V (as indicatively shown in the depicted simulation example).

Owing to the natural unbalance of the bistable circuit, the D node that is capacitively coupled through the capacitance C1 to the supply node, will track the Vdd voltage evolution on the supply node. When the voltage Vdd on the supply node reaches the threshold value (of approximately 2 V) of the nonvolatile memory element MM1, that in the shown example includes two nonvolatile memory cells connected in parallel, the memory element begins to conduct, thus establishing a current path toward the ground node of the circuit. When the current through the nonvolatile memory element MM1 exceeds the current that flows through the corresponding load transistor of the bistable circuit, the circuit switches from the preestablished unbalanced state to the opposite state.

Preferably, the nonvolatile memory cell or cells that compose the element MM1 belong to a tiny array of cells, purposely realized in order to reproduce as accurately as possible the physical-electrical characteristics of the cells of the memory array. Basically, the action exerted by the nonvolatile memory element is that of a pull-down element of the voltage on the D node acting in competition with the pull-down action on the dual P node exerted by the natural n-channel transistor M5. Therefore, the increase of the conductivity increase of the nonvolatile memory element MM1, consequent to the rising of the voltage Vdd on the supply node (and therefore on its own drain node), eventually causes the switching of the bistable circuit with the full switching on of the n-channel transistor M4 and the interdiction of the natural n-channel transistor M5. This switching brings to a high state the P node, and consequently brings the buffer B output node to a low state, thus the P.O.R. pulse to an end.

Moreover, upon the switching, the bistable circuit assumes a fully stable state that is ensured by the state of conduction of the transistor M4, which keeps at ground potential the node D that is capacitively coupled to the supply node through the capacitance C1. Naturally, under these conditions, the nonvolatile memory element MM1 as well as the pass-transistor M3, return to a nonconducting state.

In the simulation circuit diagram shown in the attached drawing, the symbols N+, P+, and N+ written into their respective rectangles, identify the P+ diffusion formed in a well area and an N+ diffusion formed in the semiconducting substrate, respectively, according to a practical implementation of the circuit in an integrated form. Though not strictly necessary for the operation of the circuit of the invention, the diffusions so pointed out in the diagram, may advantageously have an increased area (compatible with compactness requirements) in order to establish larger junction capacitances. A larger capacitance of the P+/−well junction favors, through an enhanced capacitive coupling, the tracking by the potential of the P node of the Vdd voltage on the supply node. An enhanced capacitive coupling between the N+/substrate junction favors the anchoring of the potential of the node D to the ground potential. The coupling to the two input diffusion regions $N^+$ and $P^+$ add to the capacitance of C1 and I6. Exploiting the $P^+$ diffusion in the N-well and the $N^+$ diffusion in the P substrate is a way of increasing the capacitive coupling toward supply and ground nodes, respectively. It should be further noted that the purpose of these capacitive couplings is to help the initial positioning of the latch with its D node high and its P node low (such positioning being determined primarily by the unbalance of the latch thresholds).

We claim:

1. A power-on-reset (P.O.R.) circuit comprising:
   first monitoring and comparing means for a voltage on a supply node;
   second means producing a power-on-reset (P.O.R.) signal with an amplitude that tracks the voltage on the supply node until it exceeds a certain threshold; and
   an output buffer having an input;
   said first monitoring and comparing means comprising at least one nonvolatile memory element having a control gate coupled to the supply node, and a first current terminal coupled to a ground node and a second current terminal coupled to a first node which is capacitively coupled to the supply node;
   said second means comprising an intrinsically unbalanced bistable circuit having a node that intrinsically is in a high state at power-on coupled to said first node, and having a node that intrinsically is in a low state at power-on coupled to the input of said output buffer.

2. A P.O.R. circuit according to claim 1, wherein said intrinsically unbalanced bistable circuit comprises two cross-coupled inverting stages, a first stage comprising a pair of complementary, enhancement type transistors and having an output node coupled to said first node, a second stage comprising a pair of complementary transistors having a substantially unmodified threshold and having an output node coupled to the input of said output buffer.

3. A P.O.R. circuit according to claim 1, further comprising a pass transistor having a gate coupled to the supply node; and wherein the second current terminal of said at least one nonvolatile memory element is coupled to said first node through said pass transistor.

4. A P.O.R. circuit according to claim 2, wherein said nonvolatile memory element comprises a diffusion coinciding with the second current terminal thereof; wherein the two inverting stages comprise respective diffusions coinciding with the output nodes thereof; and wherein each of said diffusions have an incremented area to increase a relative junction capacitance thereof.

5. A nonvolatile memory device comprising:
   an array of nonvolatile memory cells;
   a redundancy circuit including rows of registers for redundancy addresses;
   a plurality of power-on-reset circuits to initialize said rows of registers, each power-on-reset circuit comprising
   first monitoring and comparing means for a voltage on a supply node;
   second means producing a power-on-reset (P.O.R.) signal with an amplitude that tracks the voltage on the supply node until it exceeds a certain threshold; and
   an output buffer having an input;
   said first monitoring and comparing means comprising at least one nonvolatile memory element having a control gate coupled to the supply node, and a first current terminal coupled to a ground node and a second current terminal coupled to a first node which is capacitively coupled to the supply node;
   said second means comprising an intrinsically unbalanced bistable circuit having a node that intrinsically is in a high state at power-on coupled to said first node, and having a node that intrinsically is in a low state at power-on coupled to the input of said output buffer.

6. A device according to claim 5, wherein said intrinsically unbalanced bistable circuit comprises two cross-coupled inverting stages, a first stage comprising a pair of complementary, enhancement type transistors and having an output node coupled to said first node, a second stage comprising a pair of complementary transistors having a substantially unmodified threshold and having an output node coupled to the input of said output buffer.

7. A device according to claim 5, further comprising a pass transistor having a gate coupled to the supply node; and wherein the second current terminal of said at least one nonvolatile memory element is coupled to said first node through said pass transistor.

8. A device according to claim 6, wherein said nonvolatile memory element comprises a diffusion coinciding with the second current terminal thereof; wherein the two inverting stages comprise respective diffusions coinciding with the output nodes thereof; and wherein each of said diffusions have an incremented area to increase a relative junction capacitance thereof.

* * * * *